US012800653B2

(12) United States Patent
Li et al.

(10) Patent No.: US 12,800,653 B2
(45) Date of Patent: Nov. 17, 2026

(54) CHIP VERIFICATION METHOD AND APPARATUS, ELECTRONIC DEVICE, AND STORAGE MEDIUM

(71) Applicant: HORIZON (SHANGHAI) ARTIFICIAL INTELLIGENCE TECHNOLOGY CO., LTD., Shanghai (CN)

(72) Inventors: Zhengyu Li, Shanghai (CN); Xu Hu, Shanghai (CN)

(73) Assignee: HORIZON (SHANGHAI) ARTIFICIAL INTELLIGENCE TECHNOLOGY CO., LTD., Shanghai (CN)

( * ) Notice: Subject to any disclaimer, the term of this patent is extended or adjusted under 35 U.S.C. 154(b) by 690 days.

(21) Appl. No.: 18/361,471

(22) Filed: Jul. 28, 2023

(65) Prior Publication Data

US 2024/0036111 A1 Feb. 1, 2024

(30) Foreign Application Priority Data

Aug. 1, 2022 (CN) ......................... 202210924657.1

(51) Int. Cl.
*G01R 31/317* (2006.01)

(52) U.S. Cl.
CPC .............................. *G01R 31/31704* (2013.01)

(58) Field of Classification Search
CPC ........... G01R 31/31704; G06F 30/3308; G06F 30/33; G06F 30/20; G06F 30/398; G06F 30/367; G06F 11/3684; G06F 11/3688
(Continued)

(56) References Cited

U.S. PATENT DOCUMENTS 12,093,631 B2 9/2024 Yang et al.
2017/0170956 A1* 6/2017 Cipu .................... H04L 9/0841
(Continued)

FOREIGN PATENT DOCUMENTS

CN 107566204 A 1/2018
CN 113051855 A 6/2021
(Continued)

OTHER PUBLICATIONS

First Chinese Office Action from corresponding Chinese patent Application No. 2022109246571, mailed on Mar. 9, 2026 and its English translation.

*Primary Examiner* — Paul Dinh
(74) *Attorney, Agent, or Firm* — K&L Gates LLP

(57) ABSTRACT

Disclosed are a chip verification method and apparatus, an electronic device, and a storage medium. The method includes: obtaining data traffic mode information of a design under test of a chip in a target scenario; determining a data traffic feature corresponding to the design under test based on the data traffic mode information; constructing excitation corresponding to the design under test based on the data traffic feature; and verifying the design under test based on the excitation, to obtain a verification result of the design under test in the target scenario. According to the embodiments of this disclosure, a service scenario of the design under test can be replicated on a verification platform, so that effective verification can be performed on a work condition of the design under test in the service scenario, without constructing complex cases for scenario verification, thereby greatly improving effectiveness of scenario verification.

20 Claims, 11 Drawing Sheets

(58) Field of Classification Search
USPC .......................................................... 716/136
See application file for complete search history.

(56) References Cited

U.S. PATENT DOCUMENTS

| | | | | |
|---|---|---|---|---|
| 2018/0364304 | A1 | 12/2018 | Rastogi et al. | |
| 2022/0139219 | A1* | 5/2022 | Wang ...................... | G08G 1/04 340/907 |
| 2023/0198883 | A1* | 6/2023 | Sommers ............ | H04L 43/0823 370/252 |

FOREIGN PATENT DOCUMENTS

| | | | |
|---|---|---|---|
| CN | 113242156 | A | 8/2021 |
| CN | 113407393 | A | 9/2021 |

* cited by examiner

CHIP VERIFICATION METHOD AND APPARATUS, ELECTRONIC DEVICE, AND STORAGE MEDIUM

RELATED APPLICATION INFORMATION

This application claims priority to and the benefit of Chinese patent application No. 202210924657.1 filed on Aug. 1, 2022, which is incorporated herein by references in its entirety.

FIELD OF THE INVENTION

The present disclosure relates to chip verification technologies, and in particular, to a chip verification method and apparatus, an electronic device, and a storage medium.

BACKGROUND OF THE INVENTION

At a front-end verification stage of a chip, chip system issues related to a real service scenario may be found as early as possible by implementing scenario verification. However, the scenario verification requires construction of verification cases for the real service scenario, and the service scenario of the chip generally requires close cooperation of multiple parties. In addition to high requirements on a case development capability of a verification engineer, a software department is also required to provide underlying driving, which is usually much difficult. Therefore, it is difficult to construct such a complex verification case for the service scenario at the front-end verification stage. As a result, effective scenario verification cannot be performed.

SUMMARY OF THE INVENTION

To resolve the foregoing technical problem that effective scenario verification cannot be performed, the present disclosure is proposed. Embodiments of the present disclosure provide a chip verification method and apparatus, an electronic device, and a storage medium.

According to an aspect of the embodiments of the present disclosure, a chip verification method is provided, including: obtaining data traffic mode information of a design under test of a chip in a target scenario; determining a data traffic feature corresponding to the design under test based on the data traffic mode information; constructing excitation corresponding to the design under test based on the data traffic feature; and verifying the design under test based on the excitation, to obtain a verification result of the design under test in the target scenario.

According to another aspect of the embodiments of the present disclosure, a chip verification method is provided, including: obtaining a traffic message of a design under test of a chip in a target scenario according to a preset capturing rule; and outputting the traffic message to determine data traffic mode information of the design under test of the chip in the target scenario, so as to verify the design under test of the chip based on the data traffic mode information.

According to still another aspect of the embodiments of the present disclosure, a chip verification apparatus is provided, including: a first obtaining module, configured to obtain data traffic mode information of a design under test of a chip in a target scenario; a first processing module, configured to determine a data traffic feature corresponding to the design under test based on the data traffic mode information; a second processing module, configured to construct excitation corresponding to the design under test based on the data traffic feature; and a third processing module, configured to verify the design under test based on the excitation, to obtain a verification result of the design under test in the target scenario.

According to yet another aspect of the embodiments of the present disclosure, a chip verification apparatus is provided, including: a capturing module, configured to obtain a traffic message of a design under test of a chip in a target scenario according to a preset capturing rule; and an output module, configured to output the traffic message to determine data traffic mode information of the design under test of the chip in the target scenario, so as to verify the design under test of the chip based on the data traffic mode information.

According to still yet another aspect of the embodiments of the present disclosure, a computer readable storage medium is provided, wherein the storage medium stores a computer program, and the computer program is used for implementing the chip verification method described in any one of the foregoing embodiments of the present disclosure.

According to a further aspect of the embodiments of the present disclosure, an electronic device is provided, wherein the electronic device includes: a processor; and a memory configured to store processor-executable instructions, wherein the processor is configured to read the executable instruction from the memory and execute the instruction to implement the chip verification method described in the embodiments according to one of the foregoing aspects of the present disclosure.

According to a still further aspect of the embodiments of the present disclosure, an electronic device is provided, wherein the electronic device includes: the chip verification apparatus according to an embodiment of yet another aspect.

According to the chip verification method and apparatus, the electronic device, and the storage medium that are provided in the embodiments of the present disclosure, by obtaining the data traffic mode information of the design under test of the chip in a certain service scenario, the data traffic feature of the design under test in the service scenario may be analyzed, so that the excitation corresponding to the design under test may be constructed based on the data traffic feature. In this case, a real service scenario of the design under test may be replicated on a verification platform, so that effective verification is performed on a work condition of the design under test in the real service scenario, without constructing complex cases for scenario verification. In this way, effectiveness of scenario verification is greatly improved.

The technical solutions of the present disclosure are further described below in detail with reference to the accompanying drawings and the embodiments.

DETAILED DESCRIPTION OF THE EMBODIMENTS

Exemplary embodiments of the present disclosure are described below in detail with reference to the accompanying drawings. Obviously, the described embodiments are merely a part, rather than all of embodiments of the present disclosure. It should be understood that the present disclosure is not limited by the exemplary embodiments described herein.

It should be noted that unless otherwise specified, the scope of the present disclosure is not limited by numeric expressions, and numerical values, and relative arrangement of components and steps described in these embodiments.

Overview of the Present Disclosure

In a process of implementing the present disclosure, the inventor finds that at a front-end verification stage of a chip, chip system issues related to a real service scenario may be found as early as possible by implementing scenario verification. However, the scenario verification requires construction of verification cases for the real service scenario, and the real service scenario of the chip generally requires close cooperation of multiple parties. In addition to high requirements on a case development capability of a verification engineer, a software department is also required to provide underlying driving, which is usually much difficult. Therefore, it is difficult to construct such a complex verification case for the real service scenario at the front-end verification stage. As a result, effective scenario verification cannot be performed.

Exemplary System

Figure 1:
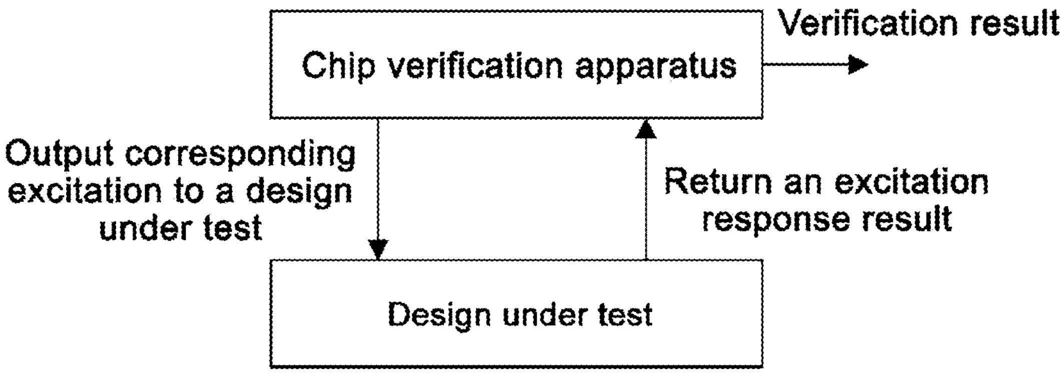
FIG. 1 is an exemplary application scenario of a chip verification method according to the present disclosure.

FIG. 1 is an exemplary application scenario of a chip verification method according to the present disclosure. When a chip needs to be verified, a chip verification method in the present disclosure may be used to place a design under test of the chip in a target scenario for work, to obtain data traffic mode information of the design under test of the chip in the target scenario. A data traffic feature of the design under test is determined based on the data traffic mode information, so that excitation corresponding to the design under test is constructed based on the data traffic feature and is output to the design under test. In response to the excitation, the design under test performs corresponding processing to obtain an excitation response result (which is also referred to as a processing result), and outputs the excitation response result to a chip verification apparatus. The chip verification apparatus obtains a verification result of the design under test in the target scenario based on the excitation response result of the design under test, to verify the design under test. In this way, effective scenario verification may be performed without requiring a verification engineer to develop complex verification cases for a service scenario, thereby effectively improving work efficiency of scenario verification. The target scenario refers to an actual service scenario to be tested, and the chip verification apparatus is configured to implement the chip verification method in the present disclosure. To place the design under test of the chip in the target scenario for work, hardware logic of the design under test pre-configured with data traffic mode capturing logic may be placed in a target device such as a FPGA (field programmable gate array) or an emulator. Based on the target device such as the FPGA or the emulator, the design under test is enabled to work in the target scenario. A traffic message of the design under test in the target scenario is captured based on the pre-configured data traffic mode capturing logic. The data traffic mode information of the design under test is obtained based on the traffic message.

The chip verification method in the present disclosure may be applied to any stage of a chip design that requires service scenario verification, which is not limited to a front-end verification stage.

Exemplary Method

Figure 2:
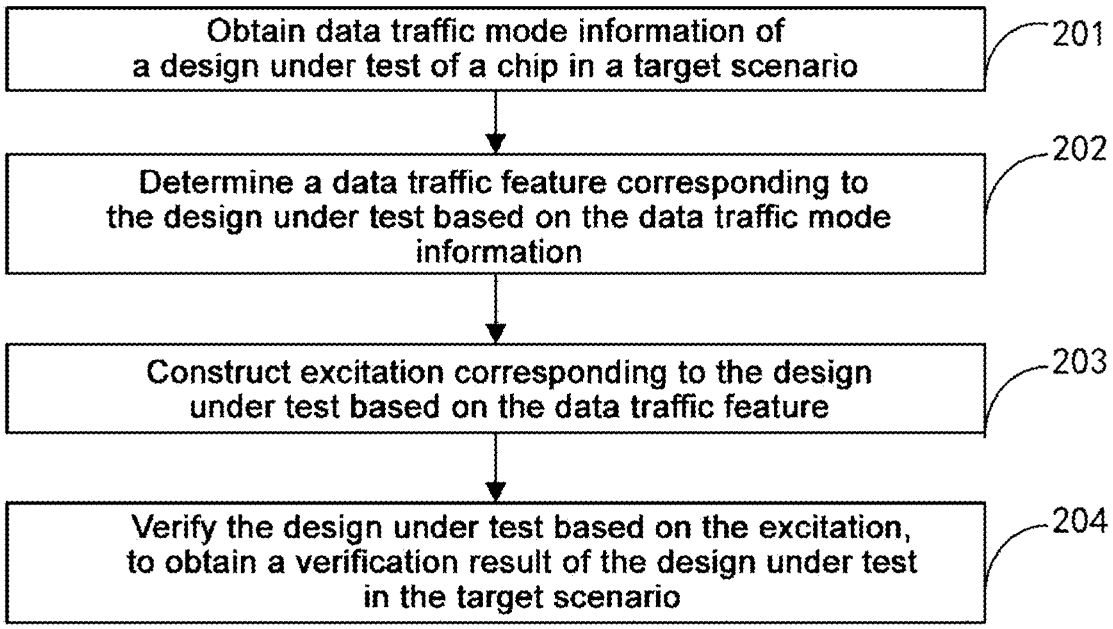
FIG. 2 is a schematic flowchart of a chip verification method according to an exemplary embodiment of the present disclosure.

FIG. 2 is a schematic flowchart of a chip verification method according to an exemplary embodiment of the present disclosure. This embodiment may be applied to an electronic device such as a server or a terminal. As shown in FIG. 2, the method includes the following steps.

Step 201. Obtain data traffic mode information of a design under test of a chip in a target scenario.

The design under test (DUT for short) is a code segment that describes a function of a to-be-tested device. The design under test of the chip is a code segment that describes a function of the chip, such as an RTL (register transfer level) code segment. The target scenario refers to a real service scenario to be tested, such as a panoramic service scenario for autonomous driving or a service scenario for voice wake-up. Specific service scenarios are not limited. The data traffic mode information is traffic mode-related information of read/write data when the design under test works in the target scenario. The specific content may be set according to actual requirements. For example, the data traffic mode information may include one or more information of the following: corresponding operation start addresses for accessing various data flows (including a read data flow and a write data flow) during at least one period, an average bit width of data of operation traffic, an average burst length of the operation traffic, an average bandwidth of the operation traffic, a first quantity of times of DDR RANK switching, a second quantity of times of DDR BANK switching, and a third quantity of times of DDR ROW switching. DDR RANK, DDR BANK, and DDR ROW respectively represent composition hierarchies of DDR, and DDR refers to a double data rate synchronous dynamic random access memory.

Step 202. Determine a data traffic feature corresponding to the design under test based on the data traffic mode information.

The data traffic feature is a relevant feature that is obtained by analyzing the data traffic mode information, and that is used to construct excitation of the design under test. The data traffic feature may include, for example, a feature for accessing the DDR, a security feature, or a feature for accessing another memory. The data traffic feature is specifically, for example, an operation type, an operation address, or an operation time interval for accessing the DDR. The operation type may include a read operation or a write operation. Correspondingly, the operation address may include an address corresponding to the read operation or an address corresponding to the write operation. The operation time interval may include a read-operation time interval or a write-operation time interval. This may be specifically set according to actual requirements.

Step 203. Construct excitation corresponding to the design under test based on the data traffic feature.

Constructing the excitation corresponding to the design under test based on the data traffic feature refers to constructing the excitation corresponding to the design under test according to a rule that conforms to the data traffic feature. For example, simulation is performed to perform a read operation or a write operation on the operation address in the data traffic feature, so that the read operation or the write operation conforms to the corresponding operation time interval, and written data conforms to a relevant data feature in the data traffic feature.

Step 204. Verify the design under test based on the excitation, to obtain a verification result of the design under test in the target scenario.

Specifically, after the excitation corresponding to the design under test is determined, the excitation may be driven to the design under test, so that the design under test responds to the excitation and performs corresponding processing to obtain a processing result (which is also referred to as an excitation response result), and to determine the verification result of the design under test based on the processing result and an expected result. The verification result may include whether the processing result of the design under test is consistent with the expected result, which may be obtained by comparing the processing result with the expected result. The verification result may also include performance, of the design under test in the target scenario, that is determined based on whether the processing result is consistent with the expected result, such as DDR bandwidth utilization of the design under test in the target scenario. A DDR read/write operation for the design under test in the target scenario may be replicated by constructing the excitation. When the processing result of the read/write operation is consistent with the expected result, the DDR bandwidth utilization may be determined based on a situation of the read/write operation during a certain period. A specific principle of obtaining the processing result by the design under test in response to the excitation is not described in detail.

In practical applications, the chip verification method in the present disclosure may be implemented based on any implementable verification environment, such as a UVM (universal verification methodology) verification environment. This may be specifically set according to actual requirements.

According to the chip verification method provided in this embodiment, by obtaining the data traffic mode information of the design under test of the chip under a certain service scenario, the data traffic feature of the design under test in the service scenario may be analyzed, so that the excitation corresponding to the design under test may be constructed based on the data traffic feature. In this case, the service scenario of the design under test may be replicated on a verification platform, so that effective verification is performed on a work condition of the design under test in the service scenario, without constructing complex cases for scenario verification. In this way, a scenario verification process is greatly simplified, and effectiveness of scenario verification is greatly improved.

Figure 3:
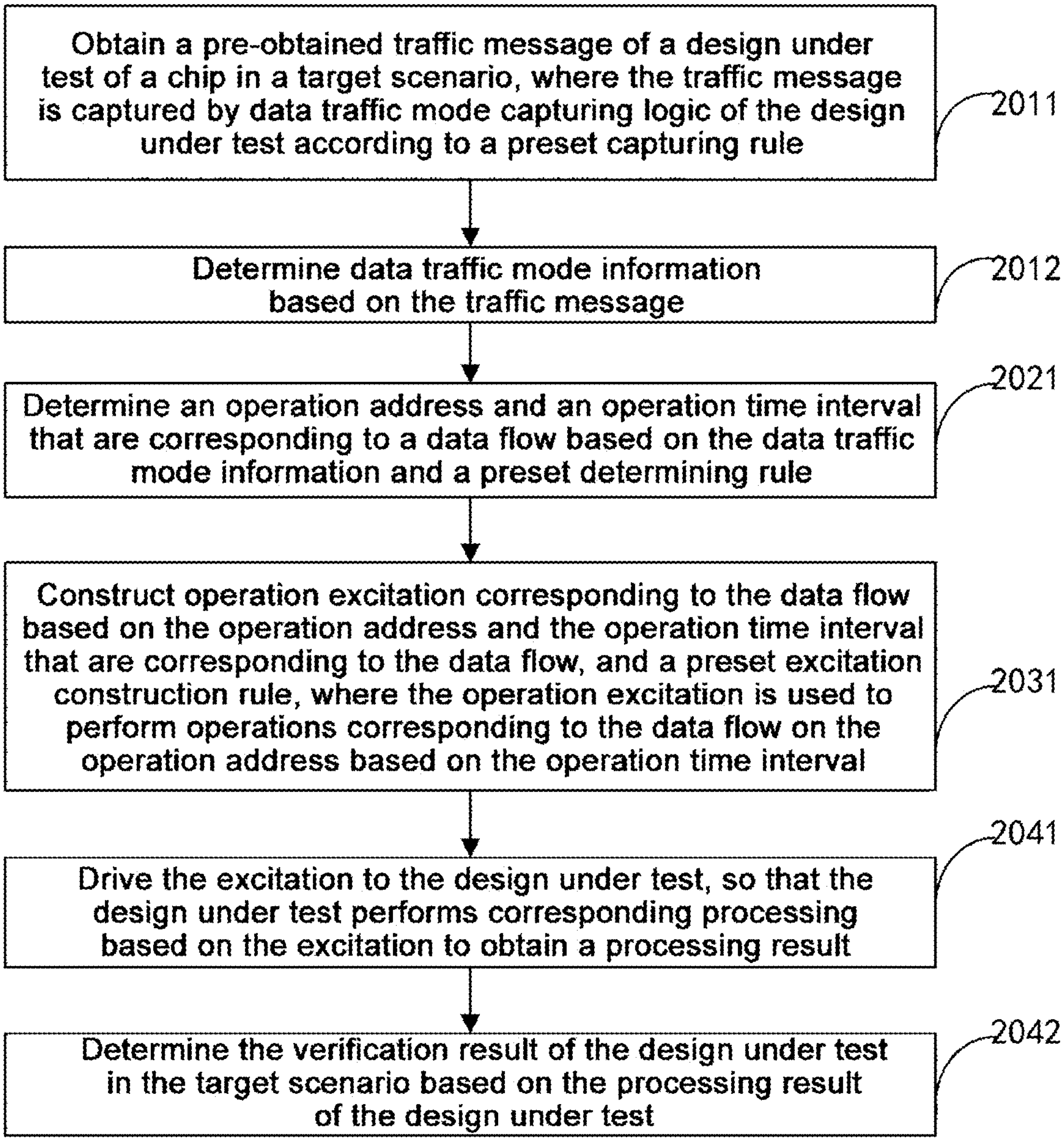
FIG. 3 is a schematic flowchart of a chip verification method according to another exemplary embodiment of the present disclosure.

FIG. 3 is a schematic flowchart of a chip verification method according to another exemplary embodiment of the present disclosure.

In an optional example, step 201 of obtaining the data traffic mode information of the design under test of the chip in the target scenario includes the following steps.

Step 2011. Obtain a pre-obtained traffic message of the design under test of the chip in the target scenario, where the traffic message is captured based on data traffic mode capturing logic of the design under test and according to a preset capturing rule.

The data traffic mode capturing logic is a code segment that describes a data traffic mode capturing function. A description language of the data traffic mode capturing logic may be the same as that of the design under test, for example, an RTL code segment. This may be specifically set according to actual requirements. The preset capturing rule is a capturing rule described by the data traffic mode capturing logic. The traffic message is an encapsulation result of data captured by an organization of the data traffic mode capturing logic. The obtained traffic message may be pre-stored in a preset storage area. When the design under test needs to be verified, the traffic message of the design under test may be obtained from the preset storage area. The traffic message of the design under test of the chip in the target scenario may include at least one traffic message. For example, if capturing is performed periodically, each period corresponds to one traffic message, and traffic messages of one or more periods may be obtained. For another example, each port of each subsystem of the chip may obtain one or more traffic messages. In practical applications, this may be specifically set according to actual requirements, and is not specifically limited.

For example, the traffic message may include an identifier (such as a number) of the data traffic mode capturing logic, a message length, a message timestamp, traffic mode information of a write data flow of a port for capturing, traffic mode information of a read data flow of the port for capturing, verification information, and the like. Specific content may be set according to actual requirements.

Step 2012. Determine the data traffic mode information based on the traffic message.

The traffic message may include traffic messages of data ports of one or more subsystems of the chip, and each data port may include one or more traffic messages. The data traffic mode information respectively corresponding to each data port may be determined based on the traffic message.

According to the present disclosure, the data traffic mode capturing logic is pre-configured in the design under test, so that traffic mode information of a data flow of each data port of the design under test in the target scenario is captured. In this case, the data traffic mode information of the design under test in the target scenario may be automatically obtained, so that a data traffic feature is obtained by analyzing the data traffic mode information, which is used to construct operation excitation of the design under test. In this way, work efficiency of chip verification is further improved.

In an optional example, the data traffic mode capturing logic includes data traffic monitoring logic attached to various data ports of the design under test, and data collection control logic communicating with various data traffic monitoring logic. The traffic message is specifically obtained according to the following manners:

placing the design under test pre-configured with the data traffic mode capturing logic in the target scenario for work, where during a work process, the data traffic monitoring logic parses traffic information of the corresponding data port based on a port protocol, performs message encapsulation on the traffic information according to a preset format to obtain a first traffic message corresponding to the data port, and reports the first traffic message to the data collection control logic; and collecting, by the data collection control logic, the first traffic messages reported by the various data traffic monitoring logic, and taking the first traffic messages respectively corresponding to the various data ports as the traffic messages of the design under test in the target scenario.

The preset format may be set according to actual requirements. That the design under test pre-configured with the data traffic mode capturing logic works in the target scenario may be implemented by using a target device such as a FPGA or an emulator. The data traffic monitoring logic is attached to each data port of the design under test, to capture the traffic information of each data port. The traffic information may include traffic information about read data and traffic information about write data. Message encapsulation is performed on the traffic information according to the preset format to obtain the first traffic message corresponding to the data port. The data traffic monitoring logic may report the first traffic message to the data collection control logic periodically, in a real-time manner, or according to scheduling of the data collection control logic. This may be specifically set according to actual requirements. For example, a reporting period may be set. The data traffic monitoring logic periodically encapsulates traffic information, of a data port monitored thereby, that is captured in the period into the first traffic message, and reports the first traffic message to the data collection control logic. The traffic information captured by the data traffic monitoring logic in the period or the first traffic message may be stored by a register. This may be specifically set according to actual requirements. The data collection control logic is responsible for scheduling all data traffic monitoring logic and collecting the first traffic message from each data traffic monitoring logic according to a protocol rule. Each first traffic message may be used as the traffic message of the design under test in the target scenario, or various first traffic messages may be aggregated according to a preset aggregation rule to be used as the traffic message of the design under test in the target scenario. This may be specifically set according to actual requirements.

Optionally, the data collection control logic may write the traffic message into the preset storage area, or may transfer the traffic message to an external device directly or through control of a CPU. This may be specifically set according to actual requirements. The preset storage area may be a storage area of any available memory, such as a preset storage area of a DDR or another memory. This may be specifically set according to actual requirements. The data collection control logic may aggregate various collected first traffic messages and write the same into the preset storage area according to a preset data format. The specific preset data format is not limited. When the design under test needs to be verified, the traffic message of the design under test in the target scenario may be read from the preset storage area, so that the traffic message is parsed to obtain the data traffic mode information.

Optionally, the CPU may also be used to control the data collection control logic to configure enablement for each data traffic monitoring logic, so that data of a required data port is captured according to actual requirements, while data may not be captured for other non-required data ports. This may be specifically set according to actual requirements.

According to the present disclosure, through the data collection control logic and the data traffic monitoring logic of the data traffic mode capturing logic, the traffic information of each data port when the design under test works in the target scenario is automatically captured and collected, which may be flexibly configured, so as to provide valid data about a real service scenario for excitation construction for verifying the design under test. In this way, verification efficiency and verification effects are further improved.

In an optional example, step 202 may specifically include the following steps.

Step 2021. Determine an operation address and an operation time interval that are corresponding to a data flow based on the data traffic mode information and a preset determining rule.

The preset determining rule may be set according to actual requirements. The data flow may include two flows: read data and write data. The operation address refers to an operation address corresponding to the read data and an operation address corresponding to the write data. The operation time interval includes a read-operation time interval and a write-operation time interval. The operation time interval indicates a time interval for initiating a corresponding operation. For example, a write operation is initiated every 3 seconds.

Correspondingly, step 203 of constructing the excitation corresponding to the design under test based on the data traffic feature includes:

Step 2031. Construct operation excitation corresponding to the data flow based on the operation address and the operation time interval that are corresponding to the data flow, and a preset excitation construction rule, wherein the operation excitation is used to perform operations corresponding to the data flow on the operation address based on the operation time interval.

The preset excitation construction rule may be set according to actual requirements. The preset excitation construction rule is used to enable the constructed operation excitation corresponding to the data flow to conform to the operation address and the operation time interval that are corresponding to the data flow, which is not specifically limited.

According to the present disclosure, the operation address and the operation time interval that are corresponding to the data flow are obtained by analyzing the data traffic mode information of the design under test in the target scenario, so that the operation excitation of the corresponding data flow of the design under test is constructed. In this way, with the operation exception, the design under test is enabled to replicate a working status in the target scenario. By comparing a response result of the design under test to the operation exception with an expected result, a verification result of the design under test in the target scenario is effectively determined.

Figure 4:
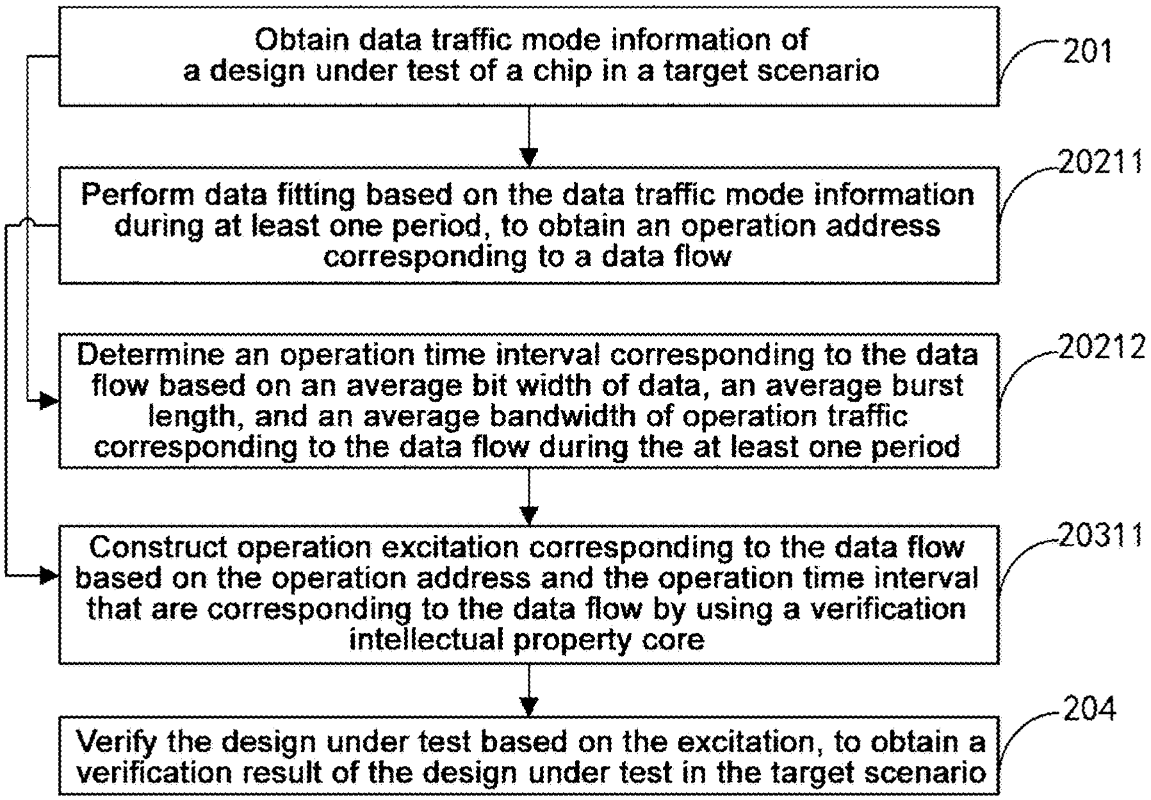
FIG. 4 is a schematic flowchart of a chip verification method according to still another exemplary embodiment of the present disclosure.

FIG. 4 is a schematic flowchart of a chip verification method according to still another exemplary embodiment of the present disclosure.

In an optional example, the data traffic mode information includes data traffic mode information during at least one period; and step 2021 of determining the operation address and the operation time interval that are corresponding to the data flow based on the data traffic mode information and the preset determining rule includes the following steps.

Step 20211. Perform data fitting based on the data traffic mode information during at least one period, to obtain the operation address corresponding to the data flow.

The period refers to a statistical period for capturing data, which may be set according to actual requirements. For example, the data traffic mode information during each period may include data traffic mode information for accessing a DDR or another memory during this period. Taking the DDR as an example (principles are similar for other memories), the data traffic mode information during each period may include one or more information of the following: corresponding operation start addresses of various data flows for accessing the DDR during this period, an average bit width of data of operation traffic, an average burst length of the operation traffic, an average bandwidth of the operation traffic, a first quantity of times of DDR RANK switching, a second quantity of times of DDR BANK switching, and a third quantity of times of DDR ROW switching. DDR RANK, DDR BANK, and DDR ROW respectively represent composition hierarchies of the DDR. The data fitting refers to fitting a set of operation addresses based on the captured operation start address in combination with other address features (such as the first quantity of times, the second quantity of times, and the third quantity of times), which is used to construct operation excitation to replicate a real data stream of the design under test in the target scenario, thereby verifying the design under test in the target scenario. This set of fitted operation addresses conforms to other address features.

For example, in the data traffic mode information during one period, a start address of a write operation is 2, the first quantity of times is 1, the second quantity of times is 2, and the third quantity of times is 3. A preset fitting algorithm is used for fitting, to obtain a set of operation addresses, that is, 2, 17, 31, and 48. This set of operation addresses conforms to address features of the first quantity of times, the second quantity of times, and the third quantity of times. This set of operation addresses are used as operation addresses for simulating the design under test in the target scenario, to replicate the data stream of the design under test in the target scenario.

Step 20212. Determine the operation time interval corresponding to the data flow based on an average bit width of data, an average burst length, and an average bandwidth of operation traffic corresponding to the data flow during the at least one period.

The average bit width of data refers to an average width of operational data during the period. For example, an average bit width of data written in the period is 32 bits. The average burst length refers to an average length of all accesses during the period. For example, if a processor CPU writes data to the DDR for a plurality of times during the period, and the data written each time has a certain length, an average length of the data written in a plurality of times is taken as the average burst length. The average bandwidth refers to a data throughput rate, and a larger bandwidth indicates a higher throughput rate.

For example, taking a write operation flow as an example, an operation time interval Ti may be determined according to the following manner:

$$Ti = 10^3 * W1 * L1/(B1 * 1000)$$

W1 represents an average bit width of data for write-data operation traffic during the period, L1 represents the average burst length, and B1 represents the average bandwidth.

Steps 20211 and 20212 are not in a sequential order.

According to the present disclosure, based on a certain amount of captured raw data traffic mode information, a data traffic feature conforming to the target scenario is fitted by using a fitting algorithm, which is used to construct excitation and replicate a large amount of data streams of the design under test in the target scenario, to verify the design under test. In this way, on the basis of improving work efficiency of chip verification, verification effects are improved.

In an optional example, step 2031 of constructing the operation excitation corresponding to the data flow based on the operation address and the operation time interval that are corresponding to the data flow, and the preset excitation construction rule includes:

Step 20311. Construct the operation excitation corresponding to the data flow based on the operation address and the operation time interval that are corresponding to the data flow by using a verification intellectual property core.

The verification intellectual property (VIP) core is a module for generating particular excitation. According to the present disclosure, after the operation address and the operation time interval respectively corresponding to each data flow are obtained, the VIP core may be called to construct the operation excitation corresponding to each data flow. A specific principle is not described herein.

In an optional example, step 204 of verifying the design under test based on the excitation, to obtain the verification result of the design under test in the target scenario includes the following steps.

Step 2041. Drive the excitation to the design under test, so that the design under test performs corresponding processing based on the excitation to obtain a processing result.

The design under test responds to the excitation, and performs a corresponding operation based on the excitation. The processing result is a result of performing the operation. For example, a processing result corresponding to a data read operation is read data, and a processing result corresponding to a data write operation is an execution result of a write operation. Specific reading and writing principles of are not described herein.

Step 2042. Determine the verification result of the design under test in the target scenario based on the processing result of the design under test.

Specifically, after the processing result of the design under test is obtained, the processing result is compared with an expected result to determine performance of the design under test in the target scenario based on a comparison result. A specific principle is not described herein.

According to the chip verification method in the present disclosure, the chip may be verified by simulating the data traffic of the chip in the real service scenario at a chip design stage. Based on the verification result, relevant personnel may accurately locate a part with a problem by viewing RTL code for analysis. Particularly, at the front-end verification stage, performance of the chip may be analyzed effectively, to provide a reliable foundation for subsequent chip design.

Any chip verification method provided in the embodiments of the present disclosure may be implemented by any suitable device with a data processing capability, including but not limited to a terminal device and a server. Alternatively, any chip verification method provided in the embodiments of the present disclosure may be implemented by a processor. For example, the processor implements any chip verification method described in the embodiments of the present disclosure by invoking corresponding instructions stored in a memory. Details are not described below again.

Figure 5:
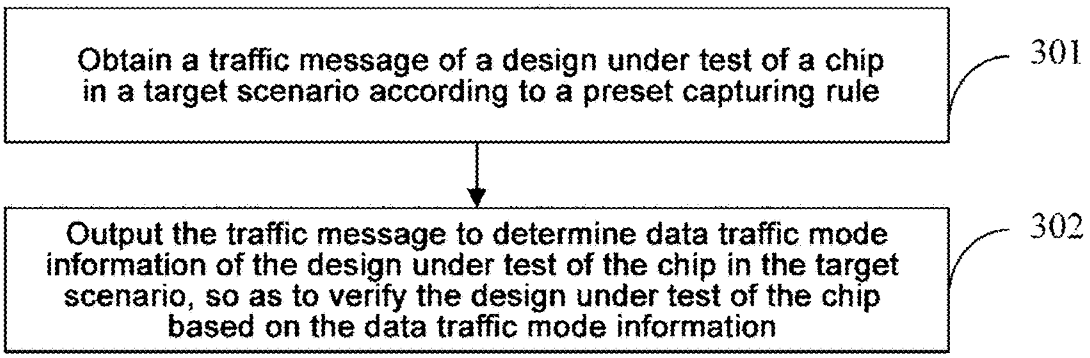
FIG. 5 is a schematic flowchart of a chip verification method according to yet another exemplary embodiment of the present disclosure.

FIG. 5 is a schematic flowchart of a chip verification method according to yet another exemplary embodiment of the present disclosure. This embodiment may be applied to an electronic device such as a server or a terminal, which is specifically, for example, an electronic device with a target device such as an emulator or a FPGA. As shown in FIG. 5, the method includes the following steps.

Step 301. Obtain a traffic message of a design under test of a chip in a target scenario according to a preset capturing rule.

The preset capturing rule is a capturing rule described by data traffic mode capturing logic. The traffic message is an encapsulation result of data captured by an organization of the data traffic mode capturing logic. The traffic message may be captured based on the data traffic mode capturing logic pre-configured in the design under test and according to the preset capturing rule.

For example, the traffic message may include an identifier (such as a number) of the data traffic mode capturing logic, a message length, a message timestamp, traffic mode information of a write data flow of a port for capturing, traffic mode information of a read data flow of the port for capturing, verification information, and the like. Specific content may be set according to actual requirements.

Step 302. Output the traffic message to determine data traffic mode information of the design under test of the chip in the target scenario, so as to verify the design under test of the chip based on the data traffic mode information.

The traffic message may be output to a preset storage area for storage, or may be directly output to a verification device that is configured to verify the design under test. For example, the traffic message is output to an electronic device that implements the chip verification method in the foregoing embodiments. The preset storage area may be a storage area in the electronic device that enables a design under test pre-configured with the data traffic mode capturing logic to work in the target scenario, or may be an external storage area of the electronic device, which is not specifically limited. For example, when hardware logic of the design under test pre-configured with the data traffic mode capturing logic is placed in the FPGA to enable the design under test to work in the target scenario, the preset storage area may be a storage area in the FPGA, or may be a storage area within the design under test. This may be specifically set according to actual requirements. When the design under test needs to be verified, the traffic message of the design under test in the target scenario may be read from the preset storage area, so that the traffic message is parsed to obtain the data traffic mode information. The design under test is verified according to the verification method in the foregoing embodiments. For a specific verification process, refer to the foregoing embodiments, and details are not described herein again.

According to the present disclosure, the traffic message of the design under test of the chip in the target scenario is automatically obtained according to the preset capturing rule, so that the data traffic mode information of the design under test in the target scenario may be determined based on the traffic message. In this case, a real service scenario of the design under test may be replicated on a verification platform based on the data traffic mode information of the design under test in the target scenario, so that effective verification is performed on a work condition of the design under test in the service scenario, without constructing complex cases for scenario verification. In this way, a scenario verification process is greatly simplified, and effectiveness of scenario verification is greatly improved.

Figure 6:
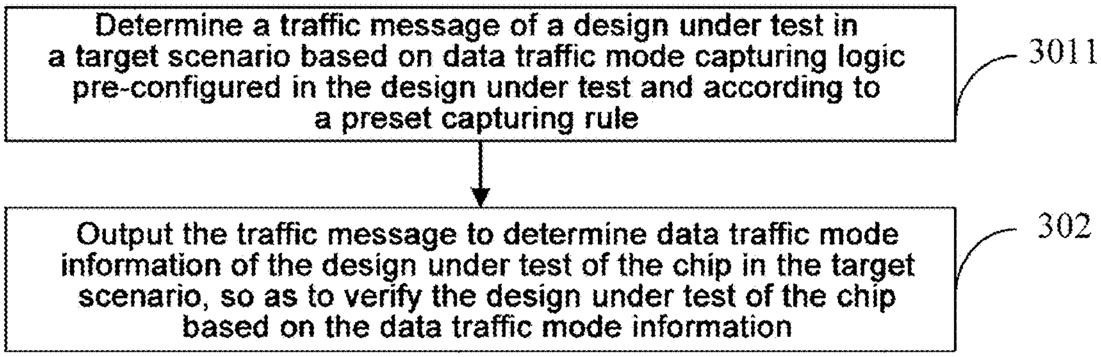
FIG. 6 is a schematic flowchart of a chip verification method according to still yet another exemplary embodiment of the present disclosure.

FIG. 6 is a schematic flowchart of a chip verification method according to still yet another exemplary embodiment of the present disclosure.

In an optional example, step 301 of obtaining the traffic message of the design under test of the chip in the target scenario according to the preset capturing rule includes:

Step 3011. Determine the traffic message of the design under test in the target scenario based on data traffic mode capturing logic pre-configured in the design under test and according to the preset capturing rule.

The data traffic mode capturing logic is a code segment that describes a data traffic mode capturing function. A description language of the data traffic mode capturing logic may be the same as that of the design under test, for example, may be an RTL code segment. This may be specifically set according to actual requirements. During specific work, the data traffic mode capturing logic may be controlled by logic of a processor CPU of the design under test. A relevant user may use the CPU to control start of the data traffic mode capturing logic, a data port for capturing, and other functions; and to configure the preset capturing rule for the data traffic mode capturing logic. This may be specifically set according to actual requirements.

Figure 7:
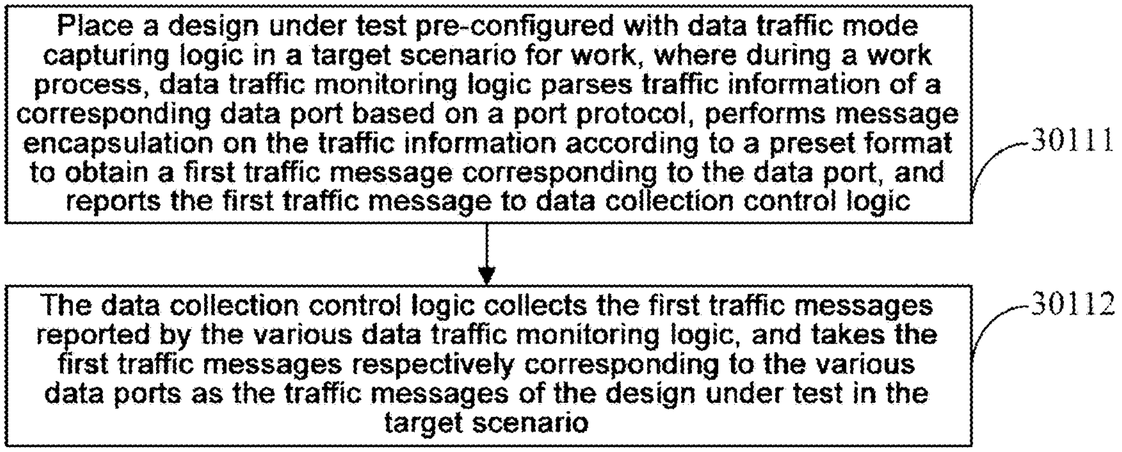
FIG. 7 is a schematic flowchart of step 3011 according to an exemplary embodiment of the present disclosure.

FIG. 7 is a schematic flowchart of step 3011 according to an exemplary embodiment of the present disclosure.

In an optional example, the data traffic mode capturing logic includes data traffic monitoring logic attached to various data ports of the design under test, and data collection control logic communicating with various data traffic monitoring logic; and step 3011 of determining the traffic message of the design under test in the target scenario based on the data traffic mode capturing logic pre-configured in the design under test and according to the preset capturing rule includes the following steps.

Step 30111. Place the design under test pre-configured with the data traffic mode capturing logic in the target scenario for work, wherein during a work process, the data traffic monitoring logic parses traffic information of the corresponding data port based on a port protocol, performs message encapsulation on the traffic information according to a preset format to obtain a first traffic message corresponding to the data port, and reports the first traffic message to the data collection control logic.

The preset format may be set according to actual requirements. Placing the design under test pre-configured with the data traffic mode capturing logic in the target scenario for work may be implemented by using a target device such as a FPGA or an emulator. The data traffic monitoring logic is attached to each data port of the design under test, to capture the traffic information of each data port. The traffic information may include traffic information about read data and traffic information about write data. Message encapsulation is performed on the traffic information according to the preset format to obtain the first traffic message corresponding to the data port. The data traffic monitoring logic may report the first traffic message to the data collection control logic periodically, in a real-time manner, or according to scheduling of the data collection control logic. This may be specifically set according to actual requirements. For example, a reporting period may be set. The data traffic monitoring logic periodically encapsulates traffic information, of a data port monitored thereby, that is captured in the period into the first traffic message, and reports the first traffic message to the data collection control logic. The traffic information captured in the period of the data traffic monitoring logic or the first traffic message may be stored by a register. This may be specifically set according to actual requirements.

Step 30112. The data collection control logic collects first traffic messages reported by the various data traffic monitoring logic, and takes the first traffic messages respectively corresponding to the various data ports as the traffic messages of the design under test in the target scenario.

The data collection control logic is responsible for scheduling all data traffic monitoring logic and collecting the first traffic message of each data traffic monitoring logic according to a protocol rule. Each first traffic message may be used as the traffic message of the design under test in the target scenario, or various first traffic messages may be aggregated according to a preset aggregation rule to be used as the traffic message of the design under test in the target scenario. This may be specifically set according to actual requirements.

Figure 8:
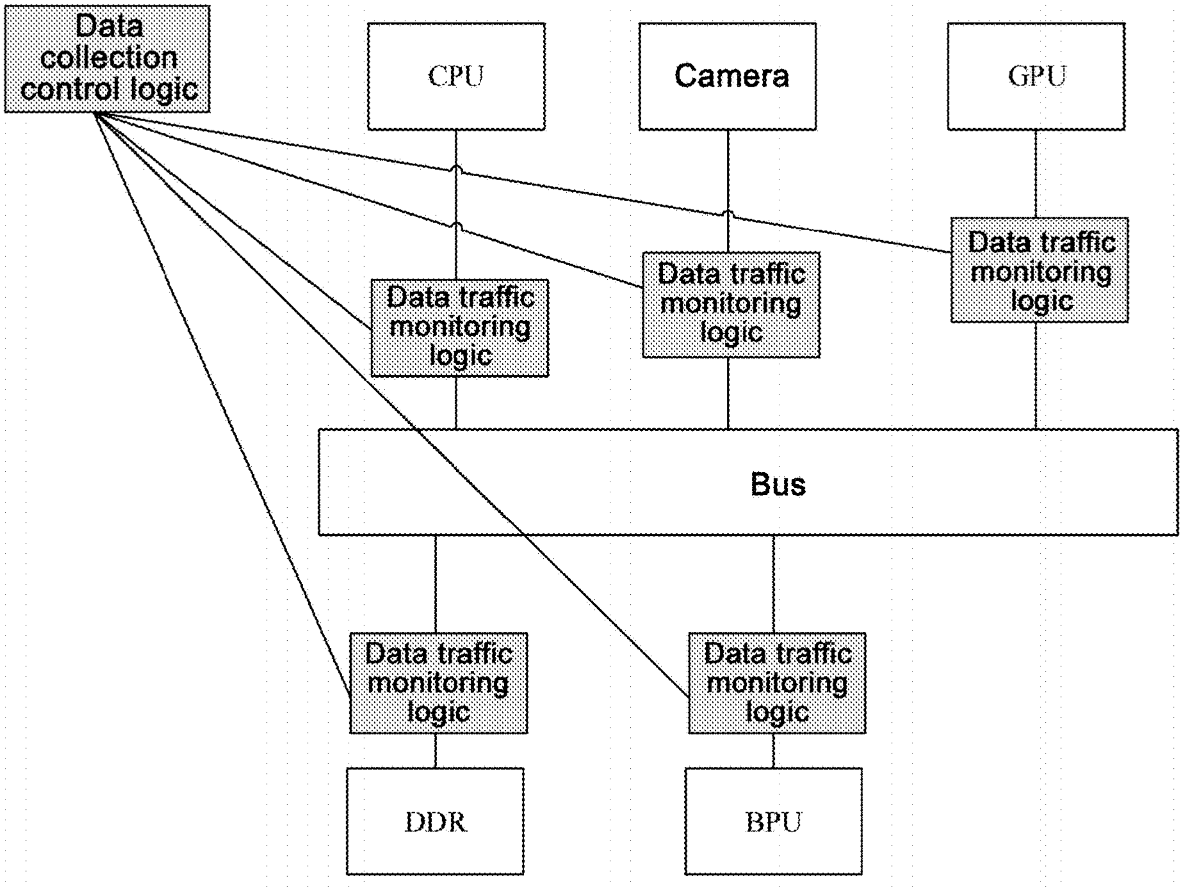
FIG. 8 is a schematic diagram of a structure of a design under test pre-configured with data traffic mode capturing logic according to an exemplary embodiment of the present disclosure.

For example, FIG. 8 is a schematic diagram of a structure of a design under test pre-configured with data traffic mode capturing logic according to an exemplary embodiment of the present disclosure. A bus may be any possible bus. For example, a NOC (network-on-chip) bus is used for on-chip interconnection. BPU (branch processing unit) represents a branch processing unit, and GPU (Graphics Processing Unit) represents a graphics processing unit. The data traffic mode capturing logic is constituted by a gray part. The data traffic monitoring logic is attached to each data port of the design under test. The data traffic monitoring logic is used to parse the traffic information of the corresponding data port based on the port protocol, performs message encapsulation on the traffic information according to the preset format to obtain the first traffic message corresponding to the data port, and reports the first traffic message to the data collection control logic. The data collection control logic collects the first traffic messages reported by the various data traffic monitoring logic, and each first traffic message is used as the traffic message of the design under test in the target scenario. The port protocol used by each data port may be set according to actual requirements. For example, it may be an AXI (advanced extensible interface) protocol. This is not specifically limited. The data collection control logic may communicate with the data traffic monitoring logic through the AXI protocol. A specific communication manner may be set according to actual requirements. The data collection control logic is controlled by the CPU, and may be responsible for unified configuration and scheduling of the various data traffic monitoring logic. In practical applications, the data traffic monitoring logic may be configured to periodically collect the traffic information of the data port. A statistical period may be configured through the data collection control logic, for example, may be configured to 1 us (microseconds), which means that every time the traffic information of the data port within 1 us is collected by the data traffic monitoring logic, the traffic information is encapsulated as the first traffic message and is reported to the data collection control logic. This may be specifically set according to actual requirements.

Optionally, the data collection control logic may write the traffic message into the preset storage area, or may transfer the traffic message to an external device directly or through control of a CPU. This may be specifically set according to actual requirements. The preset storage area may be a storage area of any available memory, such as a preset storage area of a DDR or another memory. This may be specifically set according to actual requirements. The data collection control logic may aggregate various collected first traffic messages and write the same into the preset storage area according to a preset data format. The specific preset data format is not limited. When the design under test needs to be verified, the traffic message of the design under test in the target scenario may be read from the preset storage area, so that the traffic message is parsed to obtain the data traffic mode information.

Optionally, the CPU may also be used to control the data collection control logic to configure enablement for each data traffic monitoring logic, so that data of a required data port is captured according to actual requirements, while data may not be captured for other non-required data ports. This may be specifically set according to actual requirements.

According to the present disclosure, through the data collection control logic and the data traffic monitoring logic of the data traffic mode capturing logic, the traffic information of each data port when the design under test works in the target scenario is automatically captured and collected, which may be flexibly configured, so as to provide valid data about a real service scenario for excitation construction for verifying the design under test. In this way, verification efficiency and verification effects are further improved.

In an optional example, after step 30111 of placing the design under test pre-configured with the data traffic mode capturing logic in the target scenario for work, the method further includes:

starting the data collection control logic; and controlling the data collection control logic to initialize each data traffic monitoring logic, so that the data traffic monitoring logic can parse the traffic information of the corresponding data port based on the port protocol, perform message encapsulation on the traffic information according to the preset format to obtain the first traffic message corresponding to the data port, and report the first traffic message to the data collection control logic.

Specifically, the data traffic mode capturing logic may also have a controllable start/stop function, which may be controlled by the processor. When the design under test is placed in the target scenario for work, the data collection control logic may be first controlled to be started, and the data traffic monitoring logic may be initialized through the data collection control logic. For example, a reporting period of the data traffic monitoring logic, a data capture rule (a data parsing rule), a message encapsulation format are initialized. Specific initialization content may be set according to actual requirements, and is not limited in the present disclosure.

For example, Table 1 is an example of an encapsulation format for the first traffic message of the traffic information collected by the data traffic monitoring logic according to an exemplary embodiment of the present disclosure.

TABLE 1

| ID | LEN | TIME STAMP | PAYLOAD_AW | PAYLOAD_AR | CRC |
|---|---|---|---|---|---|

The ID field stores an identifier (such as a number) of the data traffic monitoring logic; the LEN field stores a length of the first traffic message; the TIME STAMP field stores a timestamp of the first traffic message; the PAYLOAD_AW field stores traffic information of a write operation flow of a data port monitored by the data traffic monitoring logic; the PAYLOAD_AR field stores traffic information of read operation traffic of the data port monitored by the data traffic monitoring logic; and CRC represents a cyclic redundancy check.

The PAYLOAD_AW field may specifically include an AWADDR field, a WDATAWIDTH field, an AWLEN field, a BW field, an OST field, a RANK_TIMES field, a BANK_TIMES field, and a ROW_TIMES field. This may be specifically set according to actual requirements. The AWADDR field stores a start address of write operation traffic during the statistical period; the WDATAWIDTH field stores an average bit width of data of the write operation traffic during the statistical period; the AWLEN field stores an average burst length of a write command of the write operation traffic during the statistical period; the BW field stores an average bandwidth of the write operation traffic during the statistical period; the OST field stores maximum outstanding of an address port of write operation traffic during the statistical period; the RANK_TIMES field stores a quantity of times (that is, a first quantity of times) for which DDR RANK is switched at the address port of the write operation traffic during the statistical period; the BANK_TIMES field stores a quantity of times (that is, a second quantity of times) for which DDR BANK is switched at the address port of the write operation traffic during the statistical period; and the ROW_TIMES field stores a quantity of times (that is, a third quantity of times) for which DDR ROW is switched at the address port of the write operation traffic during the statistical period.

The PAYLOAD_AR field may specifically include an ARADDR field, a RDATAWIDTH field, an ARLEN field, a BW field, an OST field, a RANK_TIMES field, a BANK_TIMES field, and a ROW_TIMES field. The ARADDR field stores a start address of read operation traffic during the statistical period; the RDATAWIDTH field stores an average bit width of data of the read operation traffic during the statistical period; the ARLEN field stores an average burst length of a read command of the read operation traffic during the statistical period; the BW field stores an average bandwidth of the read operation traffic during the statistical period; the OST field stores maximum outstanding of an address port of the read operation traffic during the statistical period; the RANK_TIMES field stores a quantity of times for which DDR RANK is switched at the address port of the read operation traffic during the statistical period; the BANK_TIMES field stores a quantity of times for which DDR BANK is switched at the address port of the read operation traffic during the statistical period; and the ROW_TIMES field stores a quantity of times for which DDR ROW is switched at the address port of the read operation traffic during the statistical period.

In an optional example, placing the design under test pre-configured with the data traffic mode capturing logic in the target scenario for work includes: placing hardware logic of the design under test pre-configured with the data traffic mode capturing logic in a target device, and enabling the design under test to work in the target scenario based on the target device, wherein the target device is a device that enables the hardware logic of the design under test to work in the target scenario.

The target device may be a FPGA, an emulator, a chip sample of the design under test, or the like. This may be specifically set according to actual requirements. The FPGA device is a semi-customized circuit in an application specific integrated circuit (ASIC), which is a programmable logic array that can port a RTL of the chip to the FPGA for chip verification at a chip verification stage. In an ASIC, an ASSP (application specific standard part), and a SoC (system on chip), the FPGA device plays an indispensable role in a process from design to manufacturing. The emulator is a development tool that replaces the chip for software and hardware debugging at a development stage. By using the emulator in combination with an integrated development environment, the chip may be debugged; real-time data of various variables, a RAM, and a register may be observed to trace program execution; and a hardware circuit may also be debugged in a real-time manner, whose specific principles are not described.

Specifically, the hardware logic of the design under test pre-configured with the data traffic mode capturing logic may be placed in the target device such as the FPGA or the emulator, and the FPGA or the emulator is applied in the target scenario for work, so that the design under test works in the target scenario. For example, if the target scenario is a panoramic service scenario, the FPGA may be applied to a panoramic service scenario of a vehicle. Four cameras collect images of a surrounding environment of the vehicle and write image data to the DDR. The CPU reads the image data from the DDR and perceives based on a perceptual algorithm or a perceptual model, so that the design under test works in a real target scenario. Real traffic information of the design under test in the target scenario may be obtained by capturing the traffic information of the data port. Thus, based on the real traffic information, analysis and fitting may be performed to obtain a large quantity of data traffic features that conform to a real feature of the data traffic mode information. In this way, more excitation may be constructed to replicate a data stream of the real service scenario, thereby performing more effective verification on the design under test.

Figure 9:
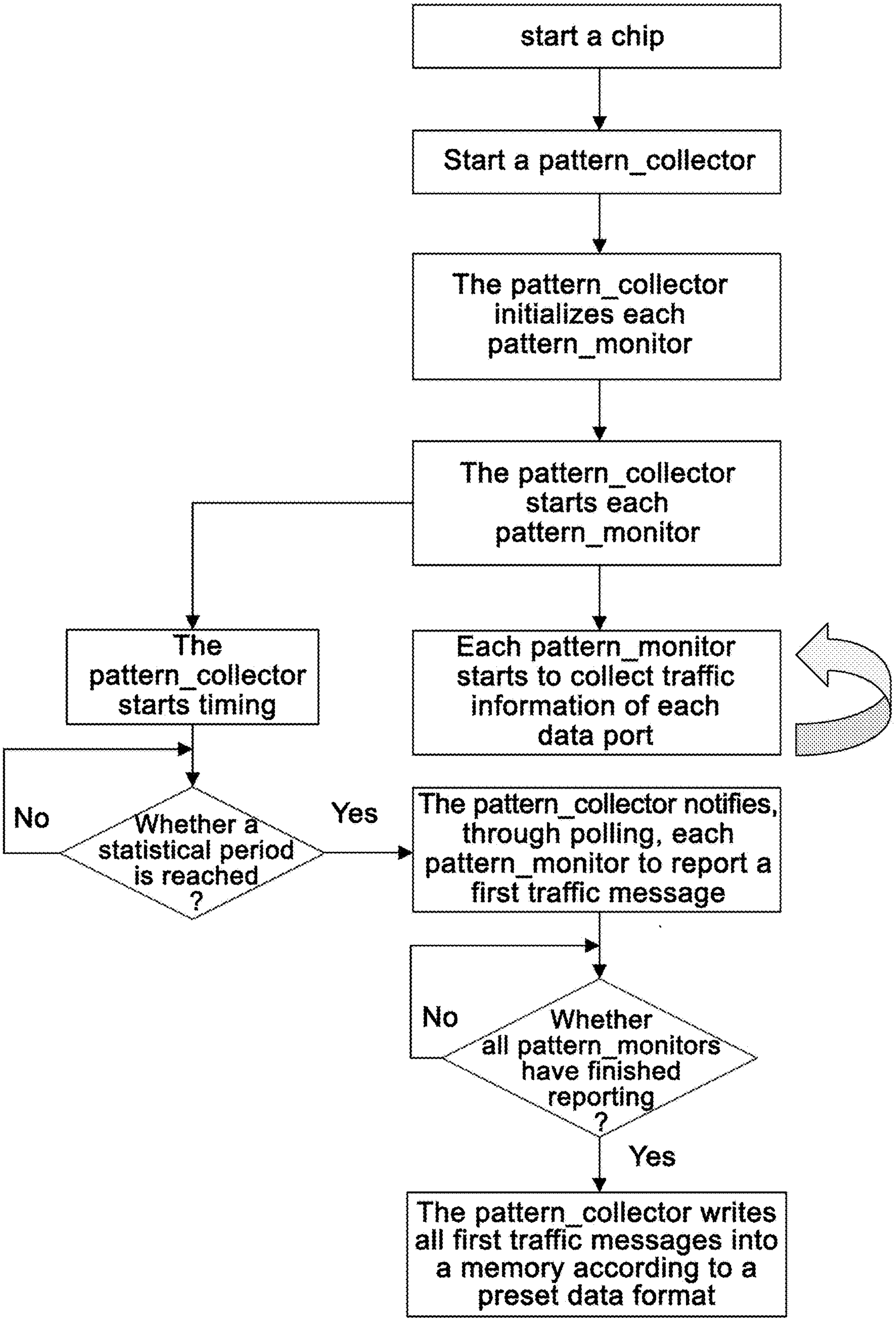
FIG. 9 is a schematic diagram of a work flow of data traffic mode capturing logic according to an exemplary embodiment of the present disclosure.

For example, FIG. 9 is a schematic diagram of a work flow of data traffic mode capturing logic according to an exemplary embodiment of the present disclosure. The data traffic mode capturing logic is pre-configured in the design under test of the chip, and the hardware logic (which is referred to as the chip) of the design under test of the chip is placed in the FPGA or the emulator. Based on the FPGA or the emulator, the design under test is enabled to work in the target scenario. In this example, the data collection control logic notifies, through polling, each data traffic monitoring logic to trigger reporting of each data traffic monitoring logic. On this basis, the work flow of the data traffic mode capturing logic is as follows.

1. Start a chip.
2. A CPU of the chip controls to start the data collection control logic (pattern_collector) in the data traffic mode capturing logic, and start the target scenario to enable the chip to work.
3. Initialize each data traffic monitoring logic (pattern_monitor) through the data collection control logic.
4. After configuration is completed, start each data traffic monitoring logic through the data collection control logic to enable each data traffic monitoring logic to start capturing traffic information of each data port.
5. The data collection control logic starts timing.
6. The data collection control logic determines whether a statistical period is reached.
7. If the statistical period is reached, the data collection control logic notifies, through polling, each data traffic monitoring logic to report a first traffic message. If the statistical period is not reached, the data collection control logic continues determining whether the statistical period is reached based on the timing.
8. After each data traffic monitoring logic is notified through polling, receive the first traffic message reported by each data traffic monitoring logic and determine whether all data traffic monitoring logic has finished reporting. If yes, the data collection control logic aggregates all first traffic messages and write the same into a memory according to a preset data format. If there is still data traffic monitoring logic that has not finished reporting, wait for reporting of the data traffic monitoring logic, and perform aggregation and storage after all the data traffic monitoring logic has finished reporting.

It should be noted that, specific content of capturing the traffic message based on the data traffic mode capturing logic in this embodiment may serve as reference to the manner of capturing the traffic message in the foregoing method embodiments of chip verification. The specific chip verification process described above may also serve as reference to the chip verification process after the traffic message is obtained in this embodiment. This is not specifically described in the method embodiments.

Any chip verification method provided in the embodiments of the present disclosure may be implemented by any suitable device with a data processing capability, including but not limited to a terminal device and a server. Alternatively, any chip verification method provided in the embodiments of the present disclosure may be implemented by a processor. For example, the processor implements any chip verification method described in the embodiments of the present disclosure by invoking corresponding instructions stored in a memory. Details are not described below again.

Exemplary Apparatus

Figure 10:
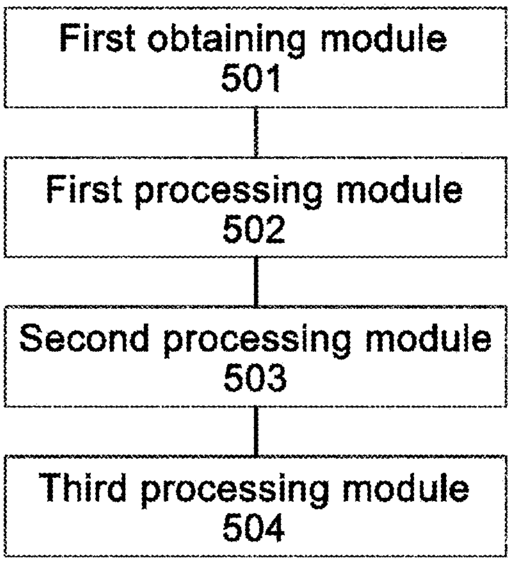
FIG. 10 is a schematic diagram of a structure of a chip verification apparatus according to an exemplary embodiment of the present disclosure.

FIG. 10 is a schematic diagram of a structure of a chip verification apparatus according to an exemplary embodiment of the present disclosure. The apparatus in this embodiment may be configured to implement the corresponding method embodiments of the present disclosure. The apparatus shown in FIG. 10 includes a first obtaining module 501, a first processing module 502, a second processing module 503, and a third processing module 504.

The first obtaining module 501 is configured to obtain data traffic mode information of a design under test of a chip in a target scenario. The first processing module 502 is configured to determine a data traffic feature corresponding to the design under test based on the data traffic mode information obtained by the first obtaining module 501. The second processing module 503 is configured to construct excitation corresponding to the design under test based on the data traffic feature determined by the first processing module 502. The third processing module 504 is configured to verify the design under test based on the excitation constructed by the second processing module 503, to obtain a verification result of the design under test in the target scenario.

Figure 11:
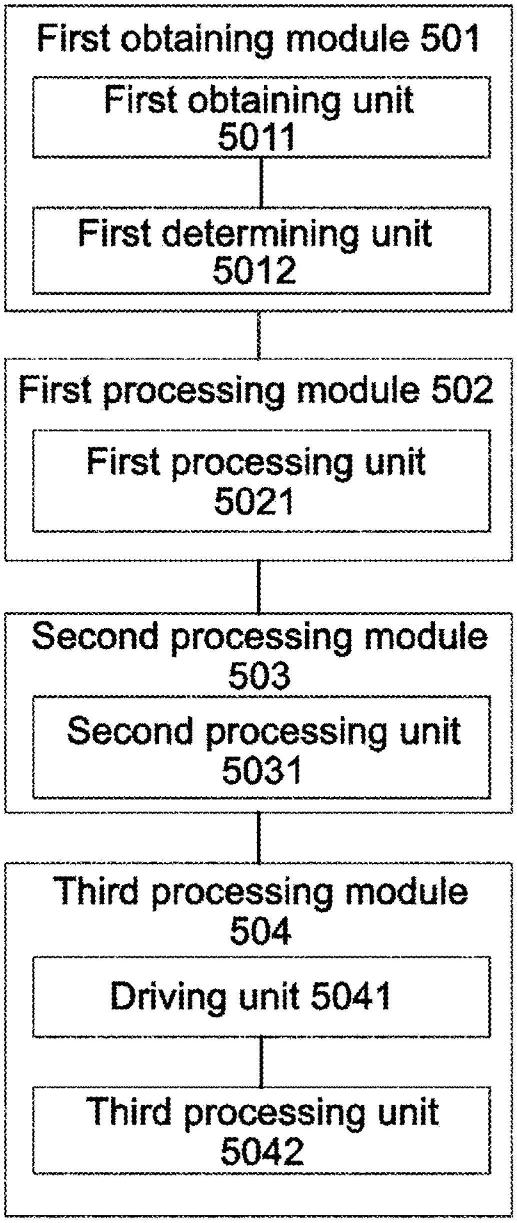
FIG. 11 is a schematic diagram of a structure of a chip verification apparatus according to another exemplary embodiment of the present disclosure.

FIG. 11 is a schematic diagram of a structure of a chip verification apparatus according to another exemplary embodiment of the present disclosure.

In an optional example, the first obtaining module 501 includes a first obtaining unit 5011 and a first determining unit 5012.

The first obtaining unit 5011 is configured to obtain a pre-obtained traffic message of the design under test of the chip in the target scenario, wherein the traffic message is captured based on data traffic mode capturing logic of the design under test and according to a preset capturing rule. The first determining unit 5012 is configured to determine the data traffic mode information based on the traffic message.

In an optional example, the data traffic mode capturing logic includes data traffic monitoring logic attached to various data ports of the design under test, and data collection control logic communicating with various data traffic monitoring logic. The traffic message is specifically obtained according to the following manners: placing the design under test pre-configured with the data traffic mode capturing logic in the target scenario for work, wherein during a work process, the data traffic monitoring logic parses traffic information of the corresponding data port based on a port protocol, performs message encapsulation on the traffic information according to a preset format to obtain a first traffic message corresponding to the data port, and reports the first traffic message to the data collection control logic; and collecting, by the data collection control logic, first traffic messages reported by the various data traffic monitoring logic, and taking the first traffic messages respectively corresponding to the various data ports as traffic messages of the design under test in the target scenario.

In an optional example, the first processing module 502 includes a first processing unit 5021 that is configured to the determine an operation address and an operation time interval that are corresponding to a data flow based on the data traffic mode information and a preset determining rule.

Correspondingly, the second processing module 503 includes a second processing unit 5031 that is configured to construct operation excitation corresponding to the data flow based on the operation address and the operation time interval that are corresponding to the data flow, and a preset excitation construction rule. The operation excitation is used to perform operations corresponding to the data flow on the operation address based on the operation time interval.

Figure 12:
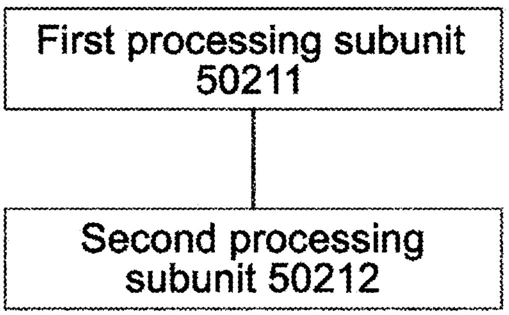
FIG. 12 is a schematic diagram of a structure of a first processing unit 5021 according to an exemplary embodiment of the present disclosure.

FIG. 12 is a schematic diagram of a structure of a first processing unit 5021 according to an exemplary embodiment of the present disclosure.

In an optional example, the data traffic mode information includes data traffic mode information during at least one period, and the first processing unit 5021 includes a first processing subunit 50211 and a second processing subunit 50212.

The first processing subunit 50211 is configured to perform data fitting based on the data traffic mode information during at least one period, to obtain the operation address corresponding to the data flow. The second processing subunit 50212 is configured to determine the operation time interval corresponding to the data flow based on an average bit width of data, an average burst length, and an average bandwidth of operation traffic corresponding to the data flow during the at least one period.

In an optional example, the second processing unit 5031 is specifically configured to construct, by using a verification intellectual property core, the operation excitation corresponding to the data flow based on the operation address and the operation time interval that are corresponding to the data flow.

In an optional example, the third processing module 504 includes a driving unit 5041 and a third processing unit 5042.

The driving unit 5041 is configured to drive the excitation to the design under test, so that the design under test performs corresponding processing based on the excitation to obtain a processing result. The third processing unit 5042 is configured to determine the verification result of the design under test in the target scenario based on the processing result of the design under test.

Figure 13:
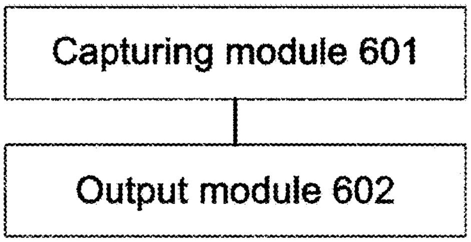
FIG. 13 is a schematic diagram of a structure of a chip verification apparatus according to still another exemplary embodiment of the present disclosure.

FIG. 13 is a schematic diagram of a structure of a chip verification apparatus according to still another exemplary embodiment of the present disclosure. The apparatus in this embodiment may be configured to implement the corresponding method embodiments of the present disclosure. The apparatus shown in FIG. 13 includes a capturing module 601 and an output module 602.

The capturing module 601 is configured to obtain a traffic message of a design under test of a chip in a target scenario according to a preset capturing rule. The output module 602 is configured to output the traffic message obtained by the capturing module 601, to determine data traffic mode information of the design under test of the chip in the target scenario, so as to verify the design under test of the chip based on the data traffic mode information.

Figure 14:
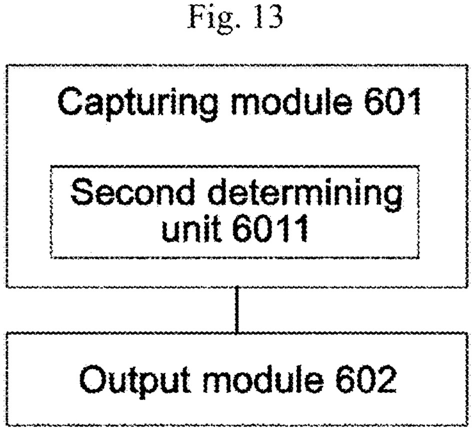
FIG. 14 is a schematic diagram of a structure of a chip verification apparatus according to yet another exemplary embodiment of the present disclosure.

In an optional example, FIG. 14 is a schematic diagram of a structure of a chip verification apparatus according to yet another exemplary embodiment of the present disclosure. In this example, the capturing module 601 includes a second determining unit 6011 that is configured to determine the traffic message of the design under test in the target scenario based on data traffic mode capturing logic pre-configured in the design under test and according to the preset capturing rule.

In an optional example, the data traffic mode capturing logic includes data traffic monitoring logic attached to various data ports of the design under test, and data collection control logic communicating with various data traffic monitoring logic. The second determining unit 6011 is specifically configured to: place the design under test pre-configured with the data traffic mode capturing logic in the target scenario for work, wherein during a work process, the data traffic monitoring logic parses traffic information of the corresponding data port based on a port protocol, performs message encapsulation on the traffic information according to a preset format to obtain a first traffic message corresponding to the data port, and reports the first traffic message to the data collection control logic; and the data collection control logic collects first traffic messages reported by the various data traffic monitoring logic, and the first traffic messages respectively corresponding to the various data ports are taken as traffic messages of the design under test in the target scenario.

Figure 15:
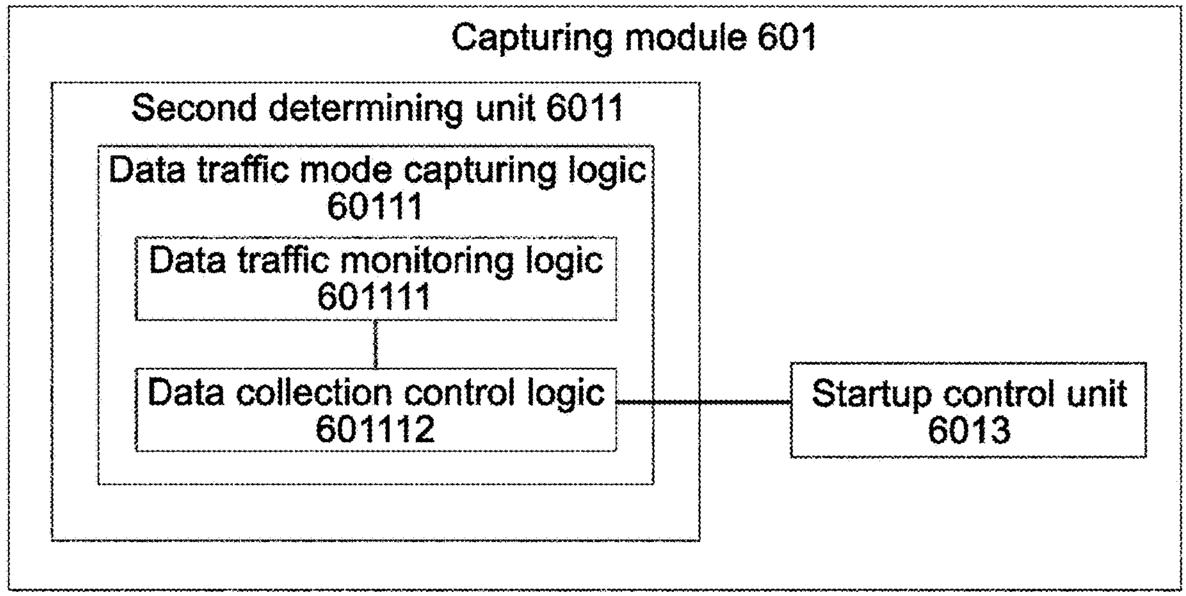
FIG. 15 is a schematic diagram of a structure of a capturing module 601 according to an exemplary embodiment of the present disclosure.

FIG. 15 is a schematic diagram of a structure of a capturing module 601 according to an exemplary embodiment of the present disclosure.

In an optional example, the second determining unit 6011 may also include data traffic mode capturing logic 60111. The data traffic mode capturing logic 60111 includes data traffic monitoring logic 601111 attached to various data ports of the design under test, and data collection control logic 601112 communicating with various data traffic monitoring logic. When the design under test pre-configured with the data traffic mode capturing logic is placed in the target scenario for work, each data traffic monitoring logic 601111 parses traffic information of the corresponding data port based on a port protocol, performs message encapsulation on the traffic information according to a preset format to obtain a first traffic message corresponding to the data port, and reports the first traffic message to the data collection control logic 601112. The data collection control logic 601112 collects first traffic messages reported by the various data traffic monitoring logic 601111, and takes the first traffic messages respectively corresponding to the various data ports as traffic messages of the design under test in the target scenario. The output module 602 outputs the traffic message to determine data traffic mode information of the design under test of the chip in the target scenario, so as to verify the design under test of the chip based on the data traffic mode information.

In an optional example, the capturing module 601 further includes:

- a startup control unit 6013, configured to start the data collection control logic, and control the data collection control logic to initialize each data traffic monitoring logic.

The startup control unit 6013 is also disposed in the design under test, and is responsible for starting the data collection control logic when the design under test is placed in the target scenario for work.

In an optional example, hardware logic of the design under test pre-configured with the data traffic mode capturing logic is placed in a target device, and the design under test is enabled to work in the target scenario based on the target device. The target device is a device that enables the hardware logic of the design under test to work in the target scenario.

Figure 16:
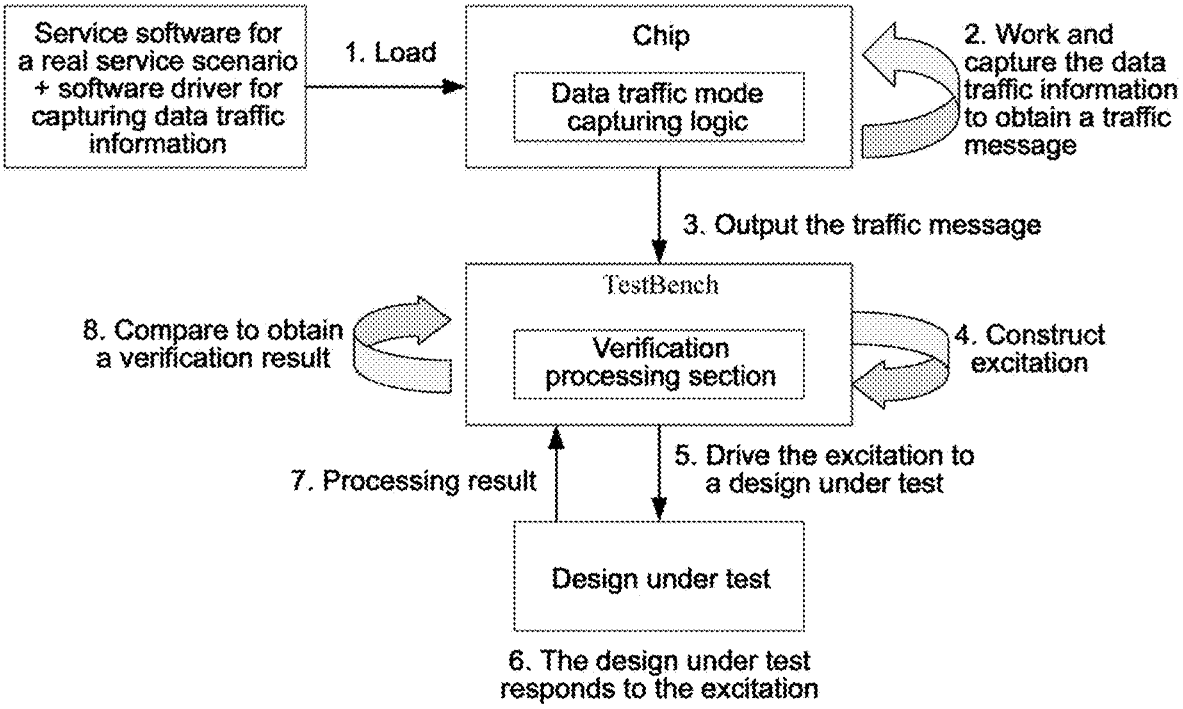
FIG. 16 is a schematic diagram of an overall architecture of chip verification work according to an exemplary embodiment of the present disclosure.

For example, FIG. 16 is a schematic diagram of an overall architecture of chip verification work according to an exemplary embodiment of the present disclosure. The chip verification apparatus in the present disclosure includes the data traffic mode capturing logic pre-configured in the chip (which is specifically the hardware logic of the design under test), and a verification processing section disposed in TestBench (a verification platform, a program, or module written in any language, which is configured to execute and verify functional correctness of a hardware model during a simulation process). The data traffic mode capturing logic is responsible for obtaining the traffic message of the design under test of the chip in the target scenario. The verification processing section is responsible for: determining the data traffic mode information based on the traffic message of the design under test in the target scenario; determining the data traffic feature corresponding to the design under test based on the data traffic mode information; constructing the excitation corresponding to the design under test based on the data traffic feature; and driving the excitation to the design under test. In response to the excitation, the design under test obtains the processing result and returns the processing result to the verification processing section of the TestBench. The verification processing section determines the verification result based on the processing result and an expected result. Service software for a real service scenario is related software that enables the chip to work in the real service scenario. A software driver for capturing data traffic information is loaded into the chip, and is executed in a CPU of the chip. It is a driver program used to control the data traffic mode capturing logic, including configuration parameters for the data traffic mode capturing logic, such as a reporting period, enablement for the data traffic monitoring logic, and other parameters. This may be specifically set according to actual requirements, and is not limited in the present disclosure.

Figure 17:
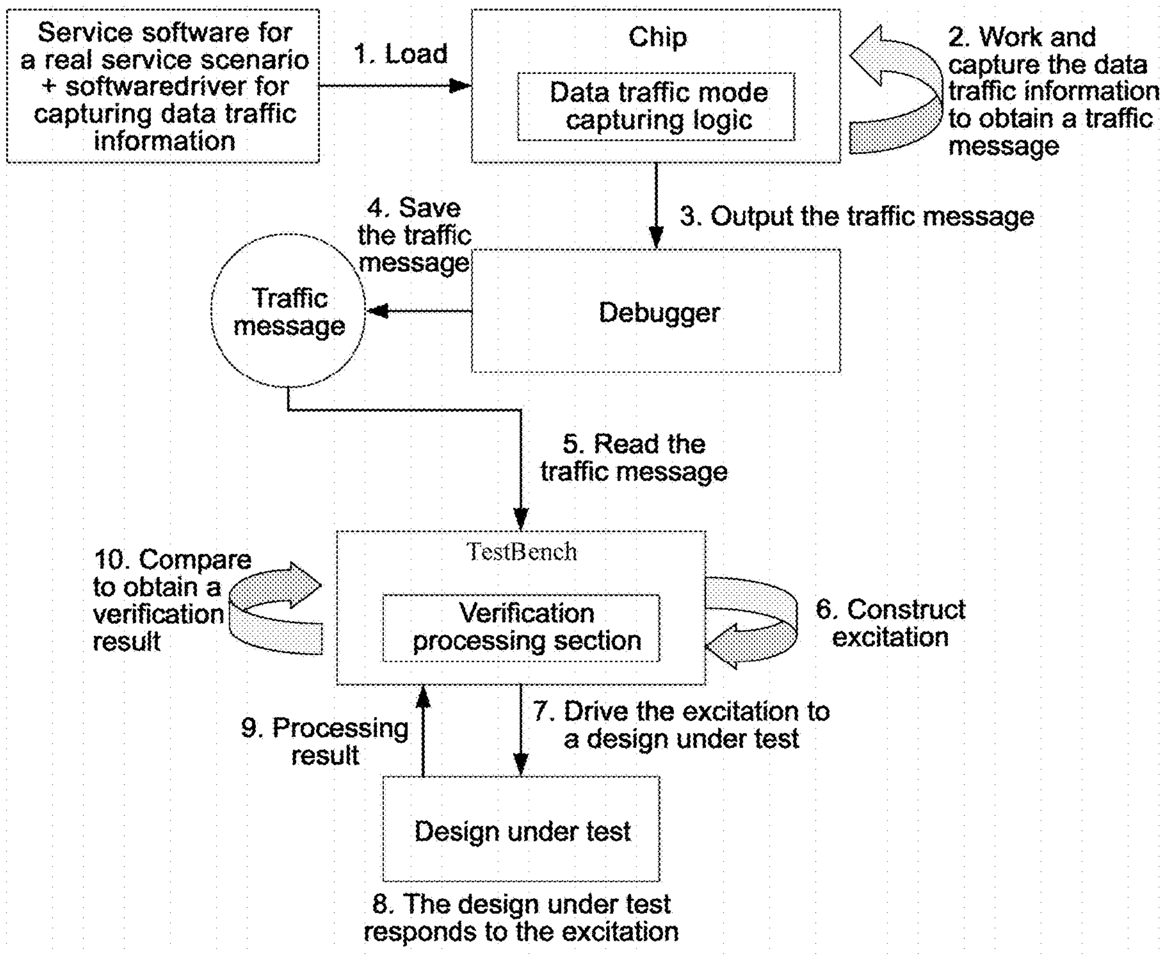
FIG. 17 is a schematic diagram of an overall architecture of chip verification work according to another exemplary embodiment of the present disclosure.

Optionally, FIG. 17 is a schematic diagram of an overall architecture of chip verification work according to another exemplary embodiment of the present disclosure. In this example, the traffic message obtained by the data traffic mode capturing logic in the chip may be first output to an external device for storage. The external device may be any possible device, such as a terminal device where the chip is located, in particular, such as a debugger. A specific storage location may be set according to actual requirements. When verification is required, the traffic message is read from a corresponding storage area. The data traffic mode information of the design under test of the chip in the target scenario is obtained based on the traffic message. The data traffic feature corresponding to the design under test is determined based on the data traffic mode information. The excitation corresponding to the design under test is constructed based on the data traffic feature, and is driven to the design under test for verification.

Exemplary Electronic Device

An embodiment of the present disclosure further provides an electronic device, including: a memory, configured to store a computer program; and a processor, configured to execute the computer program stored in the memory, wherein when the computer program is executed, the chip verification method according to any one of the foregoing embodiments of the present disclosure is implemented.

Figure 18:
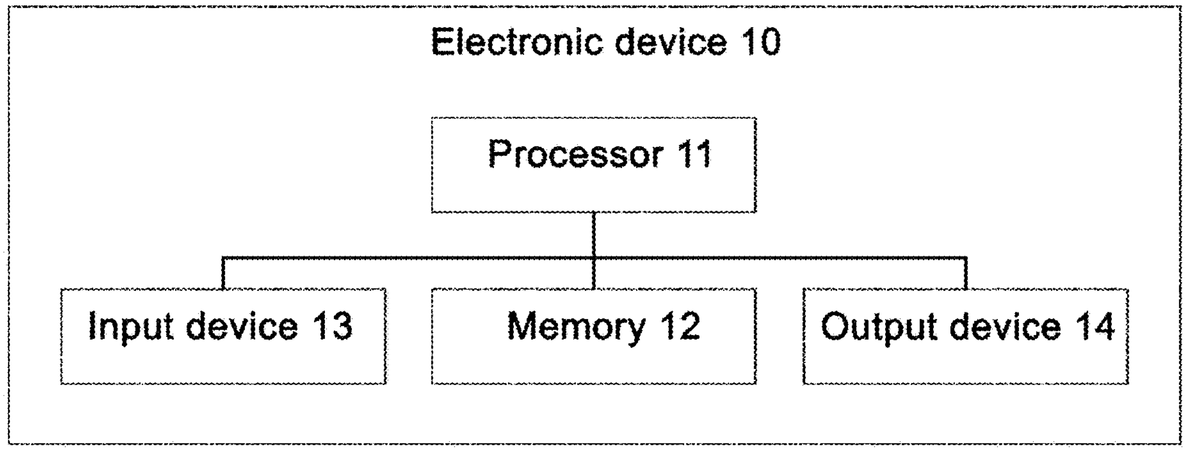
FIG. 18 is a schematic diagram of a structure of an electronic device according to an application embodiment of the present disclosure.

FIG. 18 is a schematic diagram of a structure of an electronic device according to an application embodiment of the present disclosure. In this embodiment, an electronic device 10 includes one or more processors 11 and a memory 12.

The processor 11 may be a central processing unit (CPU) or another form of processing unit having a data processing capability and/or an instruction execution capability, and may control another component in the electronic device 10 to perform a desired function.

The memory 12 may include one or more computer program products. The computer program product may include various forms of computer readable storage media, such as a volatile memory and/or a non-volatile memory. The volatile memory may include, for example, a random access memory (RAM) and/or a cache. The nonvolatile memory may include, for example, a read-only memory (ROM), a hard disk, and a flash memory. One or more computer program instructions may be stored on the computer readable storage medium. The processor 11 may execute the program instructions to implement the method according to various embodiments of the present disclosure that are described above and/or other desired functions. Various contents such as an input signal, a signal component, and a noise component may also be stored in the computer readable storage medium.

In an example, the electronic device 10 may further include an input device 13 and an output device 14. These components are connected to each other through a bus system and/or another form of connection mechanism (not shown).

For example, the input device 13 may be a microphone or a microphone array, which is configured to capture an input signal of a sound source.

In addition, the input device 13 may further include, for example, a keyboard and a mouse.

The output device 14 may output various information to the outside, including determined distance information, direction information, and the like. The output device 14 may include, for example, a display, a speaker, a printer, a communication network, and a remote output device connected by the communication network.

Certainly, for simplicity, FIG. 18 shows only some of components in the electronic device 10 that are related to the present disclosure, and components such as a bus and an input/output interface are omitted. In addition, according to specific application situations, the electronic device 10 may further include any other appropriate components.

Figure 19:
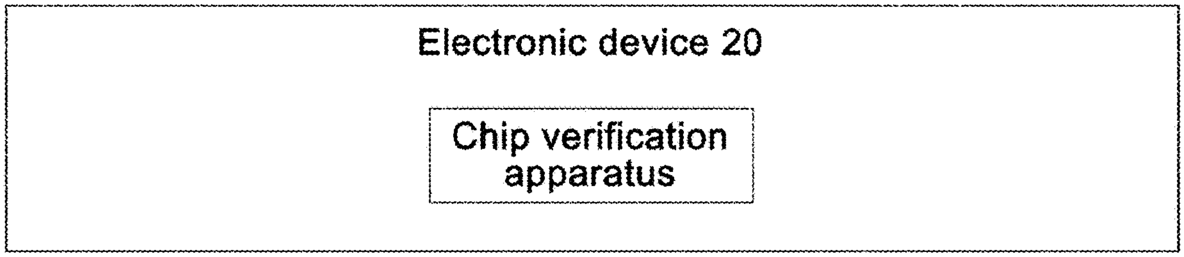
FIG. 19 is a schematic diagram of a structure of an electronic device according to another application embodiment of the present disclosure.

FIG. 19 is a schematic diagram of a structure of an electronic device according to another application embodiment of the present disclosure. In this example, an electronic device 20 includes the chip verification apparatus provided in any one of the foregoing embodiments.

Exemplary Computer Program Product and Computer Readable Storage Medium

In addition to the foregoing method and device, the embodiments of the present disclosure may also relate to a computer program product, which includes computer program instructions. When the computer program instructions are run by a processor, the processor is enabled to perform the steps, of the method according to the embodiments of the present disclosure, that are described in the "exemplary method" part of this specification.

Basic principles of the present disclosure are described above in combination with specific embodiments. However, it should be pointed out that the advantages, superiorities, and effects mentioned in the present disclosure are merely examples but are not for limitation, and it cannot be considered that these advantages, superiorities, and effects are necessary for each embodiment of the present disclosure. In addition, specific details described above are merely for examples and for ease of understanding, rather than limitations. The details described above do not limit that the present disclosure must be implemented by using the foregoing specific details.

The various embodiments in this specification are all described in a progressive way, and each embodiment focuses on a difference from other embodiments. For same or similar parts among the various embodiments, reference may be made to each other. The system embodiments basically correspond to the method embodiments, and thus are relatively simply described. For related parts, reference may be made to a part of the descriptions of the method embodiments.

The block diagrams of the equipment, the apparatus, the device, and the system involved in the present disclosure are merely exemplary examples and are not intended to require or imply that the equipment, the apparatus, the device, and the system must be connected, arranged, and configured in the manners shown in the block diagrams. It is recognized by a person skilled in the art that, the equipment, the apparatus, the device, and the system may be connected, arranged, and configured in an arbitrary manner.

The method and the apparatus in the present disclosure may be implemented in many ways. For example, the method and the apparatus in the present disclosure may be implemented by software, hardware, firmware, or any combination of the software, the hardware, and the firmware. The foregoing sequence of the steps of the method is for illustration only, and the steps of the method in the present disclosure are not limited to the sequence specifically described above, unless otherwise specifically stated in any other manner. In addition, in some embodiments, the present disclosure may also be implemented as programs recorded in a recording medium. These programs include machine-readable instructions for implementing the method according to the present disclosure. Therefore, the present disclosure further relates to a recording medium storing a program for implementing the method according to the present disclosure.

It should be further pointed out that, various components or various steps in the apparatus, the device, and the method of the present disclosure may be disassembled and/or recombined. These disassembling and/or recombinations shall be regarded as equivalent solutions of the present disclosure.

What is claimed is:

1. A chip verification method, comprising:

obtaining data traffic mode information of a design under test of a chip in a target scenario, wherein the target scenario refers to a real service scenario to be tested;

determining a data traffic feature corresponding to the design under test based on the data traffic mode information, wherein the data traffic feature comprises an operation address and an operation time interval that are corresponding to a data flow;

constructing excitation corresponding to the design under test based on the data traffic feature; and verifying the design under test based on the excitation, to obtain a verification result of the design under test in the target scenario.

2. The method according to claim 1, wherein the obtaining data traffic mode information of a design under test of a chip in a target scenario comprises:

obtaining a pre-obtained traffic message of the design under test of the chip in the target scenario, wherein the traffic message is captured by data traffic mode capturing logic of the design under test according to a preset capturing rule; and determining the data traffic mode information based on the traffic message.

3. The method according to claim 2, wherein the data traffic mode capturing logic comprises data traffic monitoring logic attached to various data ports of the design under test, and data collection control logic communicating with various data traffic monitoring logic; and the traffic message is specifically obtained according to the following manners:

placing the design under test pre-configured with the data traffic mode capturing logic in the target scenario for work, wherein during a work process, the data traffic monitoring logic parses traffic information of the corresponding data port based on a port protocol, performs message encapsulation on the traffic information according to a preset format to obtain a first traffic message corresponding to the data port, and reports the first traffic message to the data collection control logic; and collecting, by the data collection control logic, the first traffic messages reported by the various data traffic monitoring logic, and taking the first traffic messages respectively corresponding to the various data ports as the traffic messages of the design under test in the target scenario.

4. The method according to claim 2, wherein, the constructing excitation corresponding to the design under test based on the data traffic feature comprises:

constructing operation excitation corresponding to the data flow based on the operation address and the operation time interval that are corresponding to the data flow, and a preset excitation construction rule, wherein the operation excitation is used to perform an operation corresponding to the data flow on the operation address based on the operation time interval.

5. The method according to claim 4, wherein the data traffic mode information comprises data traffic mode information during at least one period; and the determining an operation address and an operation time interval that are corresponding to a data flow based on the data traffic mode information and a preset determining rule comprises:

performing data fitting based on the data traffic mode information during at least one period, to obtain the operation address corresponding to the data flow; and determining the operation time interval corresponding to the data flow based on an average bit width of data, an average burst length, and an average bandwidth of operation traffic corresponding to the data flow during the at least one period.

6. The method according to claim 4, wherein the constructing operation excitation corresponding to the data flow based on the operation address and the operation time interval that are corresponding to the data flow, and a preset excitation construction rule comprises:

constructing the operation excitation corresponding to the data flow based on the operation address and the operation time interval that are corresponding to the data flow by using a verification intellectual property core.

7. The method according to claim 1, wherein the verifying the design under test based on the excitation, to obtain a verification result of the design under test in the target scenario comprises:

driving the excitation to the design under test, so that the design under test performs corresponding processing based on the excitation to obtain a processing result; and determining the verification result of the design under test in the target scenario based on the processing result of the design under test.

8. A chip verification method, comprising:

obtaining a traffic message of a design under test of a chip in a target scenario according to a preset capturing rule, wherein the target scenario refers to a real service scenario to be tested; and outputting the traffic message to determine data traffic mode information of the design under test of the chip in the target scenario, so as to determine a data traffic feature corresponding to the design under test based on the data traffic mode information in order to verify the design under test of the chip, wherein the data traffic feature comprises an operation address and an operation time interval that are corresponding to a data flow.

9. The method according to claim 8, wherein the obtaining a traffic message of a design under test of a chip in a target scenario according to a preset capturing rule comprises:

determining the traffic message of the design under test in the target scenario based on data traffic mode capturing logic pre-configured in the design under test and according to the preset capturing rule.

10. The method according to claim 9, wherein the data traffic mode capturing logic comprises data traffic monitoring logic attached to various data ports of the design under test, and data collection control logic communicating with various data traffic monitoring logic; and the determining the traffic message of the design under test in the target scenario based on data traffic mode capturing logic pre-configured in the design under test and according to the preset capturing rule comprises:

placing the design under test pre-configured with the data traffic mode capturing logic in the target scenario for work, wherein during a work process, the data traffic monitoring logic parses traffic information of the corresponding data port based on a port protocol, performs message encapsulation on the traffic information according to a preset format to obtain a first traffic message corresponding to the data port, and reports the first traffic message to the data collection control logic; and collecting, by the data collection control logic, the first traffic messages reported by the various data traffic monitoring logic, and taking the first traffic messages respectively corresponding to the various data ports as the traffic messages of the design under test in the target scenario.

11. The method according to claim 10, wherein after the placing the design under test pre-configured with the data traffic mode capturing logic in the target scenario for work, the method further comprises:

starting the data collection control logic; and controlling the data collection control logic to initialize and configure each data traffic monitoring logic.

12. The method according to claim 10, wherein the placing the design under test pre-configured with the data traffic mode capturing logic in the target scenario for work comprises:

placing hardware logic of the design under test pre-configured with the data traffic mode capturing logic in a target device, and enabling the design under test to work in the target scenario based on the target device, wherein the target device is a device that enables the hardware logic of the design under test to work in the target scenario.

13. A computer readable storage medium, wherein the storage medium stores a computer program, and the computer program is used for implementing a chip verification method, wherein the chip verification method comprises:

obtaining data traffic mode information of a design under test of a chip in a target scenario, wherein the target scenario refers to a real service scenario to be tested;

determining a data traffic feature corresponding to the design under test based on the data traffic mode information, wherein the data traffic feature comprises an operation address and an operation time interval that are corresponding to a data flow;

constructing excitation corresponding to the design under test based on the data traffic feature; and verifying the design under test based on the excitation, to obtain a verification result of the design under test in the target scenario.

14. The computer readable storage medium according to claim 13, wherein the obtaining data traffic mode information of a design under test of a chip in a target scenario comprises:

obtaining a pre-obtained traffic message of the design under test of the chip in the target scenario, wherein the traffic message is captured by data traffic mode capturing logic of the design under test according to a preset capturing rule; and determining the data traffic mode information based on the traffic message.

15. The computer readable storage medium according to claim 14, wherein the data traffic mode capturing logic comprises data traffic monitoring logic attached to various data ports of the design under test, and data collection control logic communicating with various data traffic monitoring logic; and the traffic message is specifically obtained according to the following manners:

placing the design under test pre-configured with the data traffic mode capturing logic in the target scenario for work, wherein during a work process, the data traffic monitoring logic parses traffic information of the corresponding data port based on a port protocol, performs message encapsulation on the traffic information according to a preset format to obtain a first traffic message corresponding to the data port, and reports the first traffic message to the data collection control logic; and collecting, by the data collection control logic, the first traffic messages reported by the various data traffic monitoring logic, and taking the first traffic messages respectively corresponding to the various data ports as the traffic messages of the design under test in the target scenario.

16. The computer readable storage medium according to claim 14, wherein, the constructing excitation corresponding to the design under test based on the data traffic feature comprises:

constructing operation excitation corresponding to the data flow based on the operation address and the operation time interval that are corresponding to the data flow, and a preset excitation construction rule, wherein the operation excitation is used to perform operations corresponding to the data flow on the operation address based on the operation time interval.

17. The computer readable storage medium according to claim 16, wherein the data traffic mode information comprises data traffic mode information during at least one period; and the determining an operation address and an operation time interval that are corresponding to a data flow based on the data traffic mode information and a preset determining rule comprises:

performing data fitting based on the data traffic mode information during at least one period, to obtain the operation address corresponding to the data flow; and determining the operation time interval corresponding to the data flow based on an average bit width of data, an average burst length, and an average bandwidth of operation traffic corresponding to the data flow during the at least one period.

18. The computer readable storage medium according to claim 16, wherein the constructing operation excitation corresponding to the data flow based on the operation address and the operation time interval that are corresponding to the data flow, and a preset excitation construction rule comprises:

constructing the operation excitation corresponding to the data flow based on the operation address and the operation time interval that are corresponding to the data flow by using a verification intellectual property core.

19. The computer readable storage medium according to claim 13, wherein the verifying the design under test based on the excitation, to obtain a verification result of the design under test in the target scenario comprises:

driving the excitation to the design under test, so that the design under test performs corresponding processing based on the excitation to obtain a processing result; and determining the verification result of the design under test in the target scenario based on the processing result of the design under test.

20. The computer readable storage medium according to claim 13, wherein the obtaining data traffic mode information of a design under test of a chip in a target scenario comprises:

obtaining a traffic message of the design under test of the chip in the target scenario according to a preset capturing rule; and outputting the traffic message to determine the data traffic mode information of the design under test of the chip in the target scenario.

* * * * *